United States Patent [19]

Kaminsky

[11] Patent Number: 4,635,005
[45] Date of Patent: Jan. 6, 1987

[54] QUADRUPOLE FOR MATCHING OF A REACTANCE, INDEPENDENTLY OF THE OPERATING FREQUENCY

[75] Inventor: Didier Kaminsky, Paris, France

[73] Assignee: Thomson-CSF, Paris, France

[21] Appl. No.: 628,774

[22] Filed: Jul. 9, 1984

[30] Foreign Application Priority Data

Jul. 12, 1983 [FR] France ............................ 83 11613

[51] Int. Cl.$^4$ ............................................. H03H 7/38
[52] U.S. Cl. ............................................. 333/32; 333/33; 333/170
[58] Field of Search ............... 333/17 M, 32, 170, 171, 333/33; 330/286

[56] References Cited

U.S. PATENT DOCUMENTS

| 2,029,014 | 1/1936 | Bode | 333/170 |
| 2,093,665 | 9/1937 | Tellegen | 333/170 X |
| 2,165,086 | 7/1939 | Alford | 333/32 X |
| 2,718,622 | 9/1955 | Harkless | 333/32 X |
| 3,302,133 | 1/1967 | Buschbeck et al. | 333/32 X |
| 3,879,689 | 4/1975 | Seidel . | |

FOREIGN PATENT DOCUMENTS

755219  8/1956  United Kingdom ................. 333/32

OTHER PUBLICATIONS

Wireless World, vol. 85, No. 1524, Aug. 1979, London, "Passive Notch Filters-1", pp. 63-66 and 86. Figures 1, 5; p. 63.

*Primary Examiner*—Paul Gensler
*Attorney, Agent, or Firm*—Oblon, Fisher, Spivak, McClelland, & Maier

[57] ABSTRACT

The invention relates to a quadrupole for resistive matching of a reactance of the RLC type connected in series or in parallel, which permits to compensate for the loss of gain of an amplifier as the frequency rises, in a manner independent of the frequency. This quadrupole comprises two impedance circuits $Z_1$ and $Z_2$ in series between an input terminal and an output terminal, and in parallel with these, a third impedance circuit $Z_3$. It also comprises a fourth impedance circuit $Z_4$ connected between the point common to the first two circuits $Z_1$, $Z_2$ and the point common to the two other terminals of the quadrupole. The reactance which is to be matched is $Z_3$ if it is of the RLC type connected in parallel. It is $Z_4$ if it is of the RLC type connected in series. The values of the three other impedances $Z_1$, $Z_2$ and $Z_4$ or $Z_3$ are related so that the input impedance may be equal to the output impedance.

9 Claims, 14 Drawing Figures

QUADRUPOLE FOR MATCHING OF A REACTANCE, INDEPENDENTLY OF THE OPERATING FREQUENCY

BACKGROUND OF THE INVENTION

The present invention relates to a device, of the resistive matching quadrupole type, for matching, a reactance of the resistance/inductance/capacitance type (in series or in parallel), and providing a standing wave ratio equal to zero or very low in all cases, irrespective of the input frequency, within a very wide range of frequencies. The invention is more particularly applicable to microwaves (hyperfrequencies) and the reactance matched advantageously consists of a transistor or of a microwave amplifier.

In the microwave range, the utilization of bipolar transistors or of field effect transistors of gallium arsenide or elements of groups III-V, is ever more widespread, for several reasons:
  simplicity of application,
  low supply voltages,
  high gains,
  very high cut off frequency.

Furthermore, the design of microwave amplifiers of the very wide band transistor type, offers considerable interest, especially for satellite communications equipment, instrumentation, countermeasure and other equipment.

Producing an amplifier having a uniform gain throughout a wide band, makes it necessary however to compensate for the loss of gain of the transistors as the frequency rises.

For comparatively small bandwidths, of the order of an octave or less, the design of an amplifier of this nature is based on the techniques for production of loss-free filters, for calculation of the impedance matchers at the input and output of the amplifier, these matches may, like the transistors or amplifiers, be likened to quadrupoles. Arranging several amplifier stages in cascade with such matching quadrupoles is very difficult because the input and output standing wave ratios (SWR) may be very large, especially at low frequency, within the frequency band. As a matter of fact, if the gain of a transistor is attenuated at low frequencies in order to secure a uniform gain, the reflected wave resulting therefrom modifies the input impedance of the transistor.

On the other hand, the utilization of amplifiers of the "balanced" type assures availability of an amplifier well adapted as regards SWR over a wide range of frequencies. In this case, two identical amplifiers are situated between so-called "90° 3 dB" hybrid couplers. The power reflected at the input and output of each of the two individual amplifiers is absorbed by the load applied to the isolated output of the 90° coupler. Low SWR values are consequently assured, and the amplifiers may be connected in cascade.

The greatest limitation for a "balanced" amplifier derives primarily from the coupler. In the present state of technology, the amplification band of a balanced stage is limited to about 2 octaves. Furthermore, a balanced stage requires twice the D.C. biasing power as compared to a single matched stage, since there are two amplifiers in parallel.

Three layouts may be utilized to obtain wide band amplifiers with single matched stages:
  feedback amplifiers,
  resistive matching amplifiers,
  distributed amplifiers.

However, the input/output SWR values are not very satisfactory in these three cases, acting against connecting several stages in cascade. In the case of the resistive matching amplifier, it becomes even necessary to calculate all the combined stages.

SUMMARY OF THE INVENTION

The invention consequently relates to a resistive matching quadrupole which:
  compensates for the loss of gain of a transistor or of an amplifier as the frequency rises,
  provides a SWR value at the input and/or output, which is approximately equal to one, to the extent that the equivalent layout of the matched transistor is known, and this in a manner unaffected by the frequency, within a wide range of frequencies.

A quadrupole in accordance with the invention consequently offers a reactance-free pure impedance at the input and/or output.

The most interesting case of application of the matcher according to the invention is that of a transistor, but since a transistor is a resistance-inductance-capacitance circuit RLC, the quadrupole according to the invention is equally applicable and in more general manner to the impedance matching of any reactance.

The quadrupole according to the invention, having an input impedance $Z_e$ and an output impedance $Z_o$ combines three impedance circuits $Z_1, Z_2, Z_3$ between a first input terminal and a first output terminal: the circuits $Z_1$ and $Z_2$ are in series between the said two input and output terminals, and the circuit $Z_3$ is in parallel with the circuits $Z_1$ and $Z_2$ between the same two input and output terminals. A fourth impedance circuit $Z_4$ is connected between the junction point of the circuits $Z_1$ and $Z_2$ and the point common to the second input terminal and the second output terminal. The device of which the impedance is to be matched forms:
  either the impedance circuit $Z_3$ situated between the first input and output terminals if the device to be matched is of the RLC in parallel type,
  or the impedance circuit $Z_4$ situated between the junction point between the circuits $Z_1$ and $Z_2$ and the point common to the second input and output terminals, if the device to be matched is of the RLC in series type.

One of the impedances, $Z_3$ or $Z_4$, being necessarily that of the device which is to be matched, the other three are linked by the relationship:

$$Z_o Z_2 Z_3 + Z^2_o(Z_1+Z_2+Z_3) = Z_1 Z_3 \cdot (Z_o+Z_2+Z_4) + Z_2 Z_3 Z_4$$

if $Z_o = Z_e$, so that the impedance matching may be independent of the frequency and that the power dissipated may be selective, in such a manner as to eliminate the waves reflected at the low frequencies of the frequency range.

In a more specific manner, the invention consists in a quadrupole for matching of a reactance independently of the operating frequency, this quadrupole having an input impedance $Z_e$ between its two input terminals and an output impedance $Z_o$ between its two output terminals, and being characterized in that it comprises:
  first and second circuits in series, having the impedance $Z_1$ and $Z_2$ respectively, and a third circuit having the impedance $Z_3$ in parallel with the two aforesaid circuits, connected between a first input terminal and a first output terminal, a fourth circuit of impedance $Z_4$ connected between the point common to the first two circuits and the point common to the second input terminal and the second output terminal, at least one of the third or fourth impedances being that of the reactance which is to be matched, the values of these four impedances being related in such a manner that the quadrupole offers at its input and output terminals, a pure impedance (resistance) and a reactance equal to zero independently of the operating frequency.

BRIEF DESCRIPTION OF THE DRAWINGS

A better understanding of the invention will be obtained from the following description of several embodiments taken in conjunction with the accompanying drawings, in which.

DESCRIPTION OF THE PREFERRED EMBODIMENTS

Figure 1:
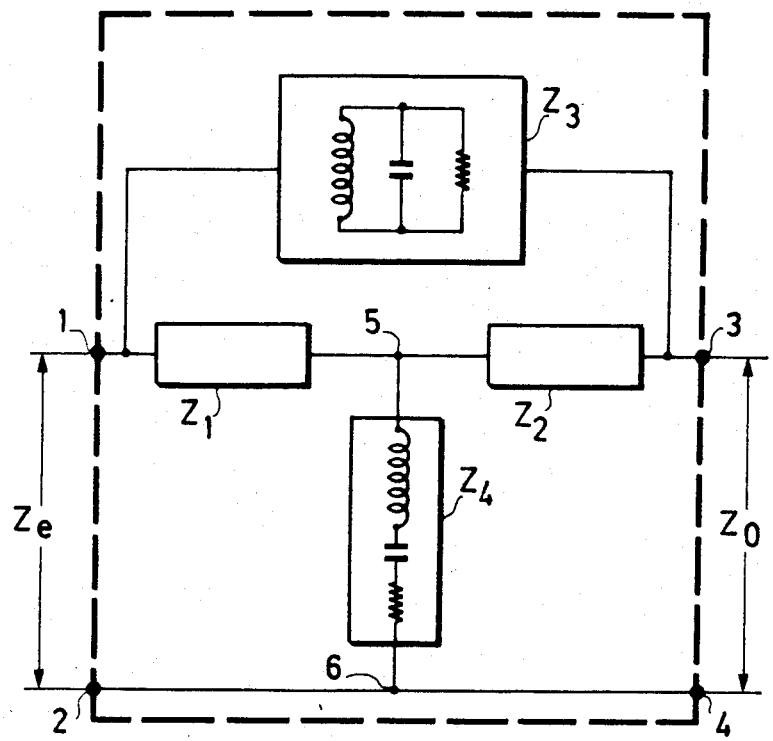
FIG. 1 illustrates a general arrangement block diagram of the matching quadrupole according to the invention.

The general arrangement of the matcher according to the invention is shown in the block diagram of FIG. 1.

Between two input terminals 1 and 2, between which exists an input impedance $Z_e$, and two output terminals 3 and 4 between which exists an output impedance $Z_o$, the matcher combines four impedances $Z_1, Z_2, Z_3, Z_4$. The impedance $Z_1$ and $Z_2$ are connected in series between the first input terminal 1 and the output terminal 3, and the impedance $Z_3$ is connected in parallel with $Z_1$ and $Z_2$ between the same terminals 1 and 3. The impedance $Z_4$ is connected between the point 5 common to the impedances $Z_1$ and $Z_2$ and the point 6 common to the second input terminal 2 and output terminal 4.

The matcher as such comprises no more than three impedances, including at least $Z_1$ and $Z_2$. The device of which the input impedance $Z_e$ is intended to be matched in a manner such that it is equal to the output impedance $Z_o$, comprises:

either the impedance $Z_3$ if the equivalent diagram of the said device is a resistance-inductance-capacitance circuit in parallel, as indicated on the block $Z_3$ of FIG. 1, or the impedance $Z_4$ if the equivalent diagram of the said device is a resistance-inductance-capacitance circuit in series, as indicated on the block $Z_4$ of FIG. 1, The branch $Z_3$ or the branch $Z_4$ being imposed by the nature of the device of which the impedance is to be matched, the other two branches are calculated: $Z_1, Z_2$ and $Z_4$ if $Z_3$ is mandatory; $Z_1, Z_2$ and $Z_3$ if $Z_4$ is mandatory.

In the case in which an iterative impedance is required, that is to say for example retaining the same value between the different stages of an amplifier, which is denoted by $Z_3 = Z_o$, the impedances of the matcher and of the device which is to be adapted are linked by the relationship:

$$Z_oZ_2Z_3 + Z_o^2(Z_1+Z_2+Z_3) = Z_1Z_3 \cdot (Z_o+Z_2+Z_4) + Z_2Z_3Z_4$$

which relationship will be referred to as "equation A" in the following. This relationship is independent of the frequency, and the matcher appears, at its input and output terminals, as a reactance-free pure impedance.

First case: matching of a device having an equivalent series-connected RLC arrangement. The impedance of a device of this kind is given by the general formula $$Z_4 = r + j(l\omega - 1/C\omega)$$

in which
r = the resistance of the device,
l = the inductance of the device, for example that of the connection wires,
C = the capacitance of the device,
$\omega$ = the pulsation
j = a constant.

Figure 2:
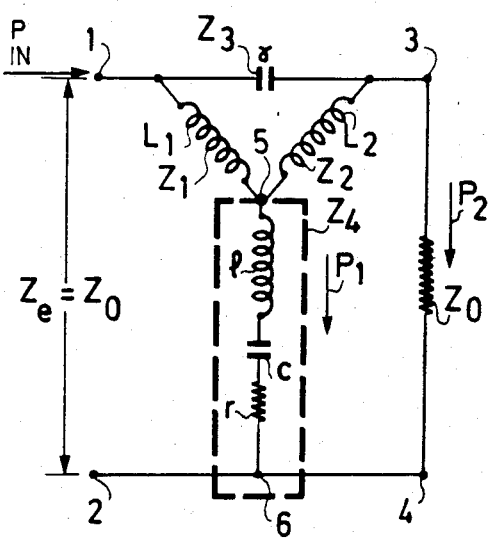
FIG. 2 illustrates a first solution of the arrangement of FIG. 1, in the case in which the device to be matched is of the series-connected RLC type.

By insertion into the equation A and by imposing the condition that $Z_o$ must be unaffected by the input frequency, several solutions are possible. One solution is illustrated in FIG. 2 with the value of the elements as functions of the load $Z_4$: the components forming the impedances $Z_1, Z_2, Z_3$ then have the following respective values:

$$L_1 = \frac{Z_oC}{2}(Z_o - r)$$

$$L_2 = \frac{Z_oC}{2}(Z_o + r)$$

$$\gamma = \frac{1}{CW_o^2Z_o^2}$$

and the inductance of the connecting wires is:

$$l = \frac{1}{CW_o^2} - \frac{(Z_o^2 - r^2)}{4}C$$

Figure 3:
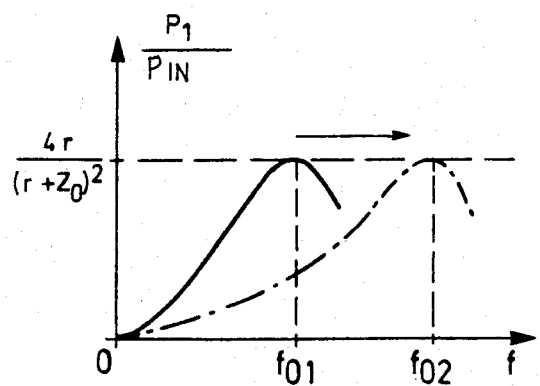
FIG. 3 is a graph showing the power absorbed in the device to be matched as a function of the resonance frequency of the preceding arrangement.

In this case, the input impedance is constant irrespective of the frequency, and equal to $Z_o$. The power $P_1$ dissipated in the resistance r of the device as a function of the frequency, which is very small a low frequencies, increases up to a maximum value for the resonance frequency fo, so that $$f_o^2 = \frac{1}{4\pi^2 \gamma (L_1 + L_2)} \text{ where } \frac{P1 \text{ max}}{P \text{ input}} = \frac{4rZ_o}{(r + Z_o)^2}$$

this value being independent of the resonance frequency fo since this power decreases for frequencies exceeding fo. Since the value of the capacitance γ depends on the value l of the inductance of the device which is to be matched, it is possible to modify the resonance frequency fo and consequently to modify the slope of the power absorbed in the resistance r, by altering the value of this inductance l. This is what is shown in FIG. 3: by modifying the inductance value l, the slope of the curve is modified, and consequently so is the power absorbed by the device. The standing wave ratio is nearly equal to one or very small independent of the input frequency. Similarly, the phase shift caused by the matcher cell at the frequency fo between the incoming and outgoing waves amounts to 180°.

Figure 4:
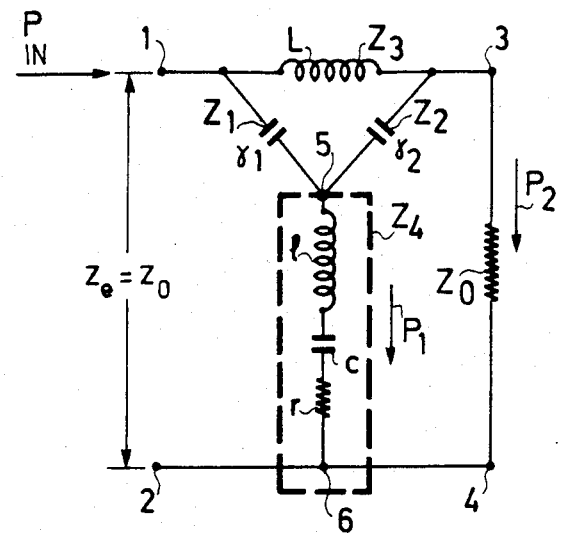
FIG. 4 illustrates a second solution of the arrangement of FIG. 1, in the case in which the device to be matched is of the series-connected RLC type.

FIG. 4 illustrates a second solution of this first case, according to the which the components forming the impedances $Z_1, Z_2$ and $Z_3$ are interchanged; Inductance L instead of capacitance γ, and capacitances $\gamma_1$ and $\gamma_2$ instead of the inductances $L_1$ and $L_2$. These components are linked by the relationships:

$$\frac{1}{\gamma_1} = \frac{Z_o}{2l} (Z_o + r)$$

$$\frac{1}{\gamma_2} = \frac{Z_o}{2l} (Z_o - r)$$

$$\frac{1}{L} = \frac{Z_o^2 - r^2}{4lZ_o^2} + \frac{1}{CZ_o^2}$$

so that $Z_e = Z_o$.

Second case: matching of a device having an equivalent in-parallel RLC arrangement.

The equation A may be transcribed into admittances and converted into the following form, which will be described as "equation B":

$$Y_o Y_2 Y_4 + Y_o^2(Y_1 + Y_2 + Y_3) = Y_1 Y_4 (Y_o + Y_2 + Y_3) + Y_2 Y_3 Y_4.$$

This equation B has precisely the same form as equation A with permutation of the part played by the elements 3 and 4, the admittance $Y_o$ in this equation B corresponding to the impedance $Z_o$ in equation A.

The admittance $Y_3$ of the device to be matched is given by the general formula:

$$Y_3 = 1 + j(C\omega - 1/l\omega)$$

1/r being equation to g.

Figure 5:
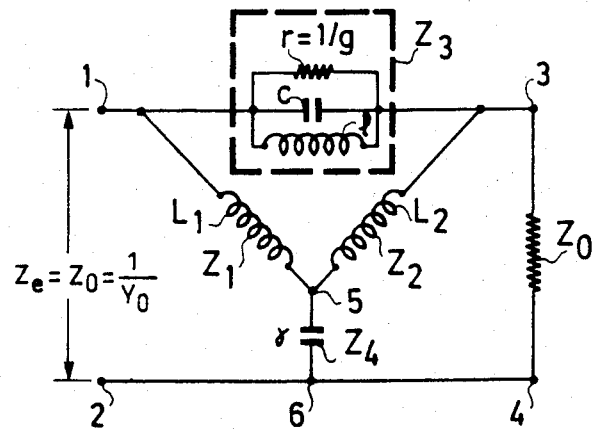
FIGS. 5 and 6 illustrate two solutions of the arrangement of FIG. 1, in the case in which the device to be matched is of the connected parallel RLC type.
Figure 6:
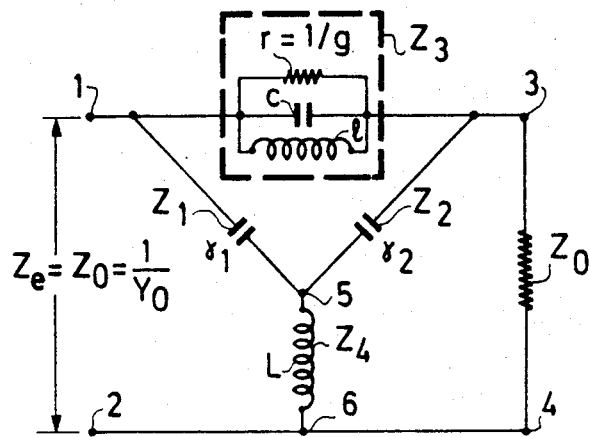

FIGS. 5 and 6 illustrate two matching arrangements without frequency limitation, of a device of which the equivalent diagram is RLC in parallel, forming the impedance $Z_3$ in the general arrangement of FIG. 1.

In the case of FIG. 5, which may be likened to FIG. 2, the impedance $Z_1$ and $Z_2$ are formed by two inductances $L_1$ and $L_2$ and the impedance $Z_4$ is formed by a capacitance γ, linked by the relationships:

$$\frac{1}{L_1} = \frac{Y_o}{2C} (Y_o - g) \text{ where } Y_o = 1/Z_o$$

$$\frac{1}{L_2} = \frac{Y_o}{2C} (Y_o + g)$$

$$\frac{1}{\gamma} = \frac{1}{Y_o^2 l} + \frac{Y_o^2 - g^2}{4CY_o^2}$$

In the case of FIG. 6, which may be likened to FIG. 4, the impedances $Z_1$ and $Z_2$ are formed by two capacitances $\gamma_1$ and $\gamma_2$, and the impedance $Z_4$ is formed by an inductance L, linked by the relationships:

$$\gamma_1 = \frac{Y_o l}{2} (Y_o - g)$$

$$\gamma_2 = \frac{Y_o l}{2} (Y_o + g)$$

$$L = \frac{l(Y_o^2 - g^2)}{4Y_o^2} + \frac{C}{Y_o^2}$$

The four arrangements of FIGS. 2, 4, 5 and 6 relate to active or passive devices which correspond to an equivalent series-connected RLC arrangement or an in-parallel RLC arrangement. The applications of these arrangements are of special interest if the device whose impedance is to be matched is a transistor.

A first example thereof is given by an embodiment of a wide band amplifier comprising field-effect transistors.

It has been stated in the foregoing that the production of an amplifier having a uniform gain over a very wide band makes it necessary to compensate the drop in gain with the frequency. Furthermore, so that several stages may be arranged in cascade, each stage should have a satisfactorily matched input impedance. The impedance matcher according to the invention assures both functions at the same time:

impedance matching irrespective of the frequency,
selective dissipation of the power as a function of the frequency.

The input impedance of a field-effect transistor on GaAs may be likened to an RLC series circuit, and for reasons of ease of biasing, the matching circuit of FIG. 2 is that which is preferred for the construction of a hybrid or integrated amplifier.

The drop in gain may be compensated by selecting the resonance frequncey fo, and it is possible thereby to obtain a uniform gain over a very wide passband with a very satisfactory input reflection coefficient. The field-effect transistors commonly being utilized with the source grounded, the terminals 2 and 4 of the circuit are taken as the ground.

Figure 7:
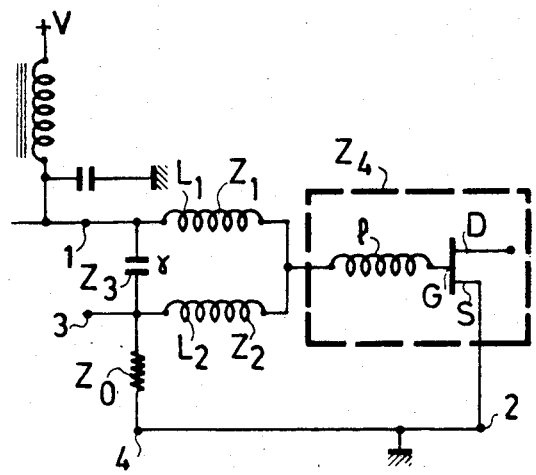
FIG. 7 illustrates a circuit diagram equivalent to FIG. 2, for input matching to a field-effect transistor.

FIG. 7 shows the circuit diagram of an amplifier stage matched as regards the input impedance, according to the general diagram of FIG. 2, in which the field-effect transistor forms the impedance $Z_4$ equivalent to an RLC circuit in series, and the impedances $Z_1, Z_2, Z_3$ respectively have the corresponding values $L_1, L_2$ and γ defined in respect of FIG. 2. An amplifier stage of this kind has a gain of 4.5 dB plus or minus 0.5 dB between 2 GHz and 14 GHz, thanks to the matching of the input SWR.

Figure 8:
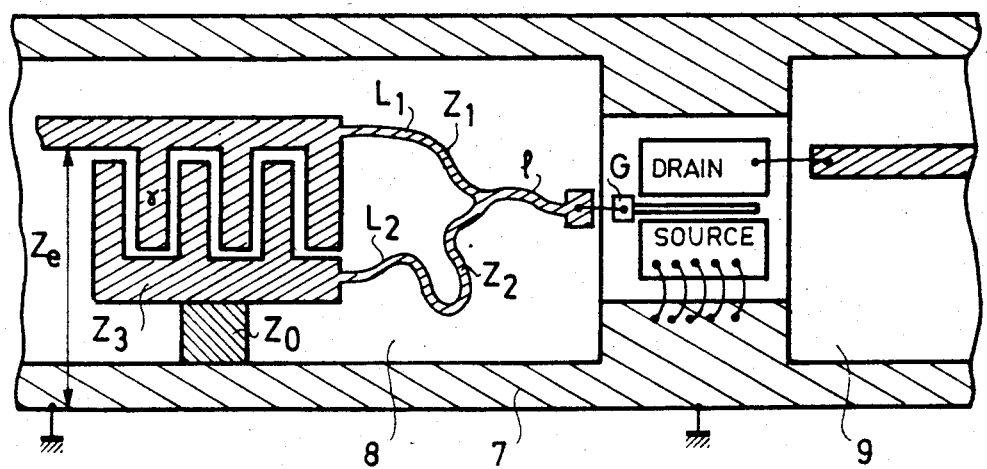
FIG. 8 illustrates an arrangement in hybrid or monolithic form of FIG. 7, FIGS. 9 to 12 illustrate circuit diagrams for output matching to a field-effect transistor, in accordance with four embodiments of the invention.

An embodiment of this stage as a hybrid or monolithic microelectronic circuit is illustrated in FIG. 8.

With respect to a metallic ground plane 7, the metallizations forming the inductances as $L_1$ and $L_2$, the capacitance $\gamma$ and the resistance $Z_o$ are carried by an insulating substrate 8, whereas the output circuit of the transistor of which the body is insulated from the ground plane 7, is carried by an insulating substrate 9. If the amplifier stage is produced as an integrated circuit, the insulating regions 8 and 9 are obtained by corresponding techniques: diffusion, implantation, etc. . . . . Depending on the values, the capacitance $\gamma$ produced by an "interleaving" technique in this case, may be formed as a sandwich structure: metal-insulator-metal, known as an overlay structure.

The output impedance of a bipolar or field-effect transistor being able to be likened to an RLC circuit in parallel, the impedance matcher according to the invention is equally applied for matching of the output impedance. In this case, the one or the other of the matching circuits illustrated in FIGS. 5 and 6 are appropriate but, depending on whether the terminal 1 corresponds to the source or the drain of the transistor, this terminal 1 is then either grounded or the output of the matcher according to the invention. FIGS. 9 to 12 illustrate the circuit diagrams of these four cases of output impedance matching.

Figure 9:
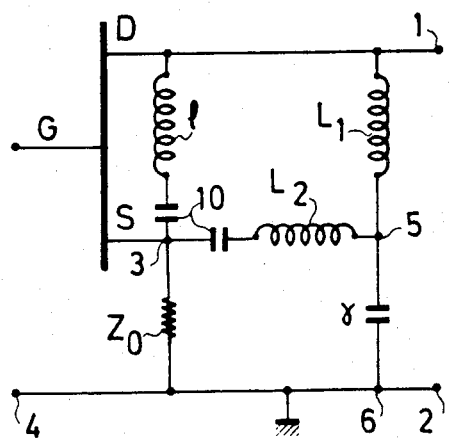
Figure 10:
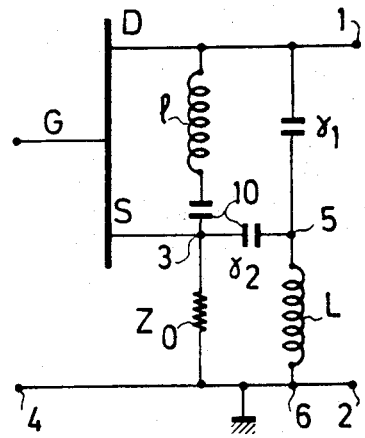

In the two cases of FIGS. 9 and 10 corresponding to FIGS. 5 and 6 respectively, inductances 1 are necessarily in parallel with the drain-source impedance, which raises the risk of short-circuiting the biasing of the transistor. Consequently, these inductances should be decoupled by means of high-value capacitances in series, which complicates the circuits: these are the capacitances marked 10. Furthermore, in both cases of FIGS. 9 and 10, the source is no longer directly grounded and the input impedance can no longer be matched easily.

Figure 11:
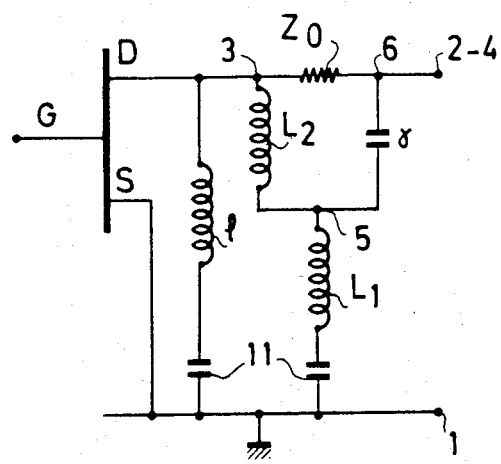
Figure 12:
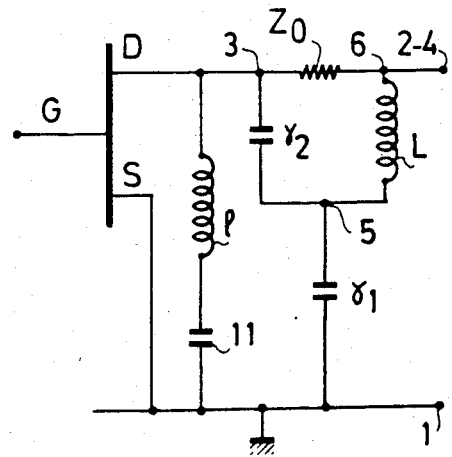

Regarding the layouts of FIGS. 11 and 12, the source is grounded and the parallel inductance 1 may be decoupled by means of a high-value grounded capacitance 11, which makes biasing very easy over a very wide band.

In the case of FIG. 11, the inductance 1 which corresponds to the connecting wire of the transistor, may even be suppressed and the biasing may be performed by means of the two inductances $L_1$ and $L_2$.

Figure 13:
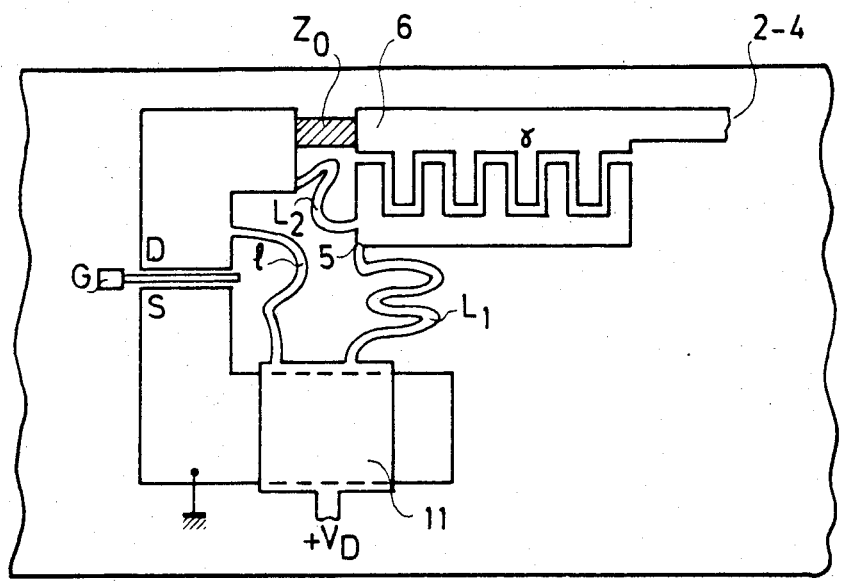
FIG. 13 illustrates an arrangement in hybrid or monolithic form of FIG. 9.

An embodiment of FIG. 11 formed by a microelectronic or a monolithic technique, is shown in FIG. 13. In this case, the capacitance $\gamma$ is formed by means of interleaved metallization, whereas the two decoupling capacitances 11 are produced as a so-called metal-insulator-metal overlay structure.

Figure 14:
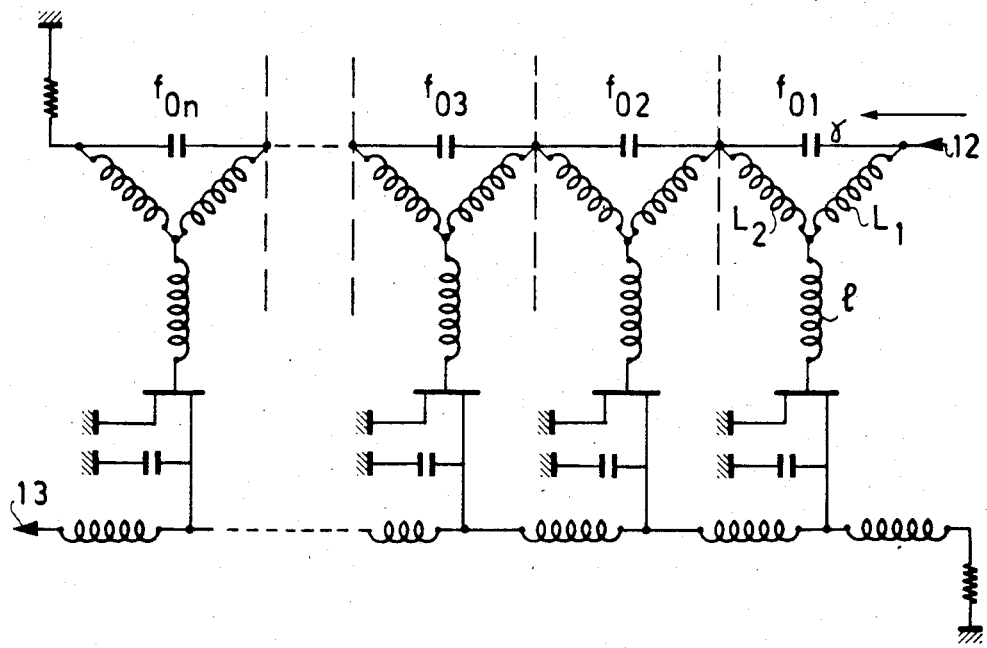
FIG. 14 illustrates a circuit diagram of a travelling wave amplifier, utilizing the matching quadrupole in accordance with the invention.

A second embodiment of the impedance matcher according to the invention is given in FIG. 14: since there is an iterative impedance, it is possible to generate a periodic structure which is impedance matched at the input and output to the same impedance $Z_o$ by reason of the matcher according to the invention, and to produce a travelling wave amplifier in this manner. This amplifier is conseqently formed by a plurality of cells connected in cascade, each cell being formed by a quadrupole according to the invention, of which the output impedance $Z_o$ forms the input impedance $Z_e$ of the following quadrupole in the cascade.

The input of this travelling wave amplifier occurs at the terminal 12, and the output at the terminal 13. For each amplifier stage, the values $L_1 L_2$ and $\gamma$ of the impedances of the matcher according to the invention are calculated in order to obtain a uniform gain as a function of the frequency.

If all the resonance frequencies $f_{oi}$ are identical for each stage, a "conventional" travelling wave structure is obtained, the power applied to each transistor decreasing along the structure.

However, by utilizing the fact that the resonance frequency of each cell may be modified, it is possible by the so-called "taperization" technique, to assure equality of the power inputs into the transistors at the top of a band in order to obtain power amplifiers. Reverting to the statements made regarding the graph of FIG. 3, the power of each stage of the travelling wave amplifier is adjusted by acting on the value of the inductance 1 of each transistor as a function of the value of the capacitance $\gamma$ which modifies the slope of the graph and by way of consequence the power absorbed for a frequency f. In FIG. 14, the resonance frequencies $f_o$ are a maximum at the side of the input terminal 12 and a minimum at the side of the output terminal 13.

A travelling wave amplifier of this kind is preferably constructed in accordance with the quadrupole of FIG. 2 since it allows an easier biasing of the transistors than with the quadrupole of FIG. 4.

The impedance matcher in accordance with the invention is defined by means of the following claims.

I claim:

1. A quadrupole for matching a reactance independently of the operating frequency, said quadrupole presenting an input impedance $Z_e$ between its two input terminals and an output impedance $Z_o$ between its two output terminals, comprising:

between a first input terminal and a first output terminal, a first circuit and a second circuit connected in series having impedances $Z_1$ and $Z_2$ respectively, and a third circuit having impedance $Z_3$ connected in parallel with said first and second circuits;

a fourth circuit having impedance $Z_4$ connected between the point common to said first and second circuits and the point common to the second input terminal and the second output terminal, at least one of the third circuit or a fourth circuit being the reactance which is to be matched, the values of these four impedances being linked by the relationship:

$$Z_o Z_2 Z_3 + Z_o^2(Z_1 + Z_2 + Z_3) = Z_1 Z_3(Z_o + Z_2 + Z_4) + Z_2 Z_3 Z_4$$

so that $Z_e = Z_o$, the quadrupole appoaches a pure impedance and approaches a zero reactance at its input/output terminals, irrespective of the operating frequency.

2. A matching quadrupole according to claim 1, wherein said third circuit is the reactance which is to be matched is equivalent to a circuit of the RLC resistance-inductance-capacitance type in parallel.

3. A matching quadrupole according to claim 1, wherein said fourth circuit is the reactance which is to be matched is equivalent to an RLC resistance-inductance-capacitance circuit in series.

4. A matching quadrupole according to claim 1, wherein said fourth circuit is the reactance which is to be matched is equivalent to an RLC circuit in series, having a resistance r, and inductance l and a capacitance C, the first impedance circuit $Z_1$ is an inductance of the value $L_1$, the second impedance circuit $Z_2$ is an inductance of the value $L_2$, the third impedance circuit $Z_3$ is a capacitance of the value $\gamma$, these three values being linked by the relationships $$L_1 = \frac{Z_oC}{2}(Z_o - r)$$

$$L_2 = \frac{Z_oC}{2}(Z_o + r)$$

$$\gamma = \frac{1}{C\omega_o^2 Z_o^2}$$

$$l = \frac{1}{C\omega_o^2} - \frac{(Z_o^2 - r^2)C}{4}$$

where $\gamma(L_1+L_2)\omega_o^2=1$ $\omega$ being the angular velocity.

5. A matching quadrupole according to claim 1, wherein said fourth circuit is the reactance which is to be matched is equivalent to a series-connected RLC type circuit, having a resistance r, an inductance l and a capacitance C, the second impedance circuit $Z_2$ is a capacitance of the value $\gamma_2$, the third impedance circuit $Z_3$ is an inductance of the value L, these three values being linked by the relationships $$\frac{1}{\gamma_1} = \frac{Z_o}{2l}(Z_o + r)$$

$$\frac{1}{\gamma_2} = \frac{Z_o}{2l}(Z_o - r)$$

$$\frac{1}{L} = \frac{Z_o^2 - r^2}{4lZ_o^2} + \frac{1}{CZ_o^2}$$

6. A matching quadrupole according to claim 1, wherein said third circuit is the reactance which is to be matched being equivalent to a circuit of the RLC type connected in parallel having a resistance r, an inductance l and a capacitance C, the first impedance circuit is an inductance having the value $L_1$, the second impedance circuit $Z_2$ is an inductance having the value $L_2$, the fourth impedance circuit $Z_4$ is a capacitor having the value $\gamma$, these three values being linked by the relationships $$\frac{1}{L_1} = \frac{Y_o}{2C}(Y_o - g)$$

$$\frac{1}{L_2} = \frac{Y_o}{2C}(Y_o + g)$$

$$\frac{1}{\gamma} = \frac{1}{Y_o^2 l} + \frac{Y_o^2 - g^2}{4CY_o^2}$$

where $Y_o=1/Z_o$ and $g=1/r$.

7. A matching quadrupole according to claim 1, wherein said third circuit is the reactance which is to be matched is equivalent to a circuit of the RLC type connected in parallel, having a resistance r, an inductance l and a capacitance C, the first impedance circuit $Z_1$ is a capacitance having the value $\gamma_1$, the second impedance circuit $Z_2$ is a capacitance having the value $\gamma_2$, the fourth impedance circuit $Z_4$ is an inductance having the value L, these three values being linked by the relationships $$\gamma_1 = \frac{Y_ol}{2}(Y_o - g)$$

$$\gamma_2 = \frac{Y_ol}{2}(Y_o + g)$$

$$L = \frac{l(Y_o^2 - g^2)}{4Y_o^2} + \frac{C}{Y_o^2}$$

where $Y_o=1/Z_o$ and $g=1/r$.

8. A quadrupole for matching a reactance independently of the operating frequency, said quadrupole presenting an input impedance $Z_e$ between its two input terminals and an output impedance $Z_0$ between its two output terminals, comprising:
  between a first input terminal and a first output circuit terminal, a first circuit and a second circuit connected in series, having impedances $Z_1$ and $Z_2$ respectively, and a third circuit having an impedance $Z_3$ connected in parallel to said first and second circuits;
  a fourth circuit having impedance $Z_4$ connected between the point common to said first and second circuits and the point common to the second input terminal and the second output terminal;
  said third circuit being the reactance which is to be matched, equivlanet to a circuit of the RLC resistance-inductance-capacitance type in parallel;
  the values of these four impedances being linked by the relationship:

$$Z_0Z_2Z_3+Z_0^2(Z_1+Z_2+Z_3)=Z_1Z_3(Z_0+Z_2+Z_4)+Z_2Z_3Z_4,$$

so that $Z_e=Z_0$.

9. A quadrupole for matching a reactance independently of the operating frequency, said quadrupole presenting an input impedance $Z_e$ between its two input terminals and an output impedance $Z_0$ between its two output terminals, comprising:
  between a first input terminal and a first output terminal, a first circuit and a second circuit connected in series, having impedances $Z_1$ and $Z_2$ respectively, and a third circuit having an impedance $Z_3$ connected in parallel to said first and second circuits;
  a fourth circuit havin impedance $Z_4$ connected between the point common to said first and second circuits and the point common to the second input terminal and the second output terminal;
  said fourth circuit being the reactance which is to be matched, equivalent to a circuit of the RLC resistance-inductance-capacitance type in series;
  the values of these four impedances being linked by the relationship:

$$Z_0Z_2Z_3+Z_0^2(Z_1+Z_2+Z_3)=Z_1Z_3(Z_0+Z_2+Z_4)+Z_2Z_3Z_4,$$

so that $Z_e=Z_0$.

* * * * *